(12) United States Patent
Farkas et al.

(10) Patent No.: US 10,700,459 B1
(45) Date of Patent: Jun. 30, 2020

(54) CIRCUIT BOARD FLEX CABLE SYSTEM

(71) Applicant: Dell Products L.P., Round Rock, TX (US)

(72) Inventors: Sandor Farkas, Round Rock, TX (US); Bhyrav Mutnury, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/256,512

(22) Filed: Jan. 24, 2019

(51) Int. Cl.
*H05K 1/00* (2006.01)
*H01R 12/77* (2011.01)
*H05K 3/36* (2006.01)
*H01R 12/79* (2011.01)

(52) U.S. Cl.
CPC .......... *H01R 12/775* (2013.01); *H01R 12/79* (2013.01); *H05K 3/361* (2013.01)

(58) Field of Classification Search
USPC ........................................................ 361/749
See application file for complete search history.

(56) References Cited

U.S. PATENT DOCUMENTS

2005/0136703 A1* 6/2005 Van Schuylenbergh ..................... H01R 12/78 439/67
2014/0133108 A1* 5/2014 Kagaya ..................... H01P 1/02 361/748

* cited by examiner

*Primary Examiner* — Andargie M Aychillhum
(74) *Attorney, Agent, or Firm* — Haynes and Boone, LLP

(57) ABSTRACT

A circuit board flex cable system includes a flex cable extending from a circuit board. A data transmission stack extends through the flex cable and the circuit board, and includes a first ground layer extending along its length and including a first grounding element, and a second ground layer extending along its length, spaced part from the first ground layer, and including a second grounding element. A signal layer in the data transmission stack extends along the length of the data transmission stack, is located between the first ground layer and the second ground layer, and includes a signal element that transmits signals. A third grounding element in the signal layer of the data transmission stack is provided adjacent the signal element and extends along a length of the data transmission stack adjacent to a termination of the flex cable in the circuit board.

17 Claims, 15 Drawing Sheets

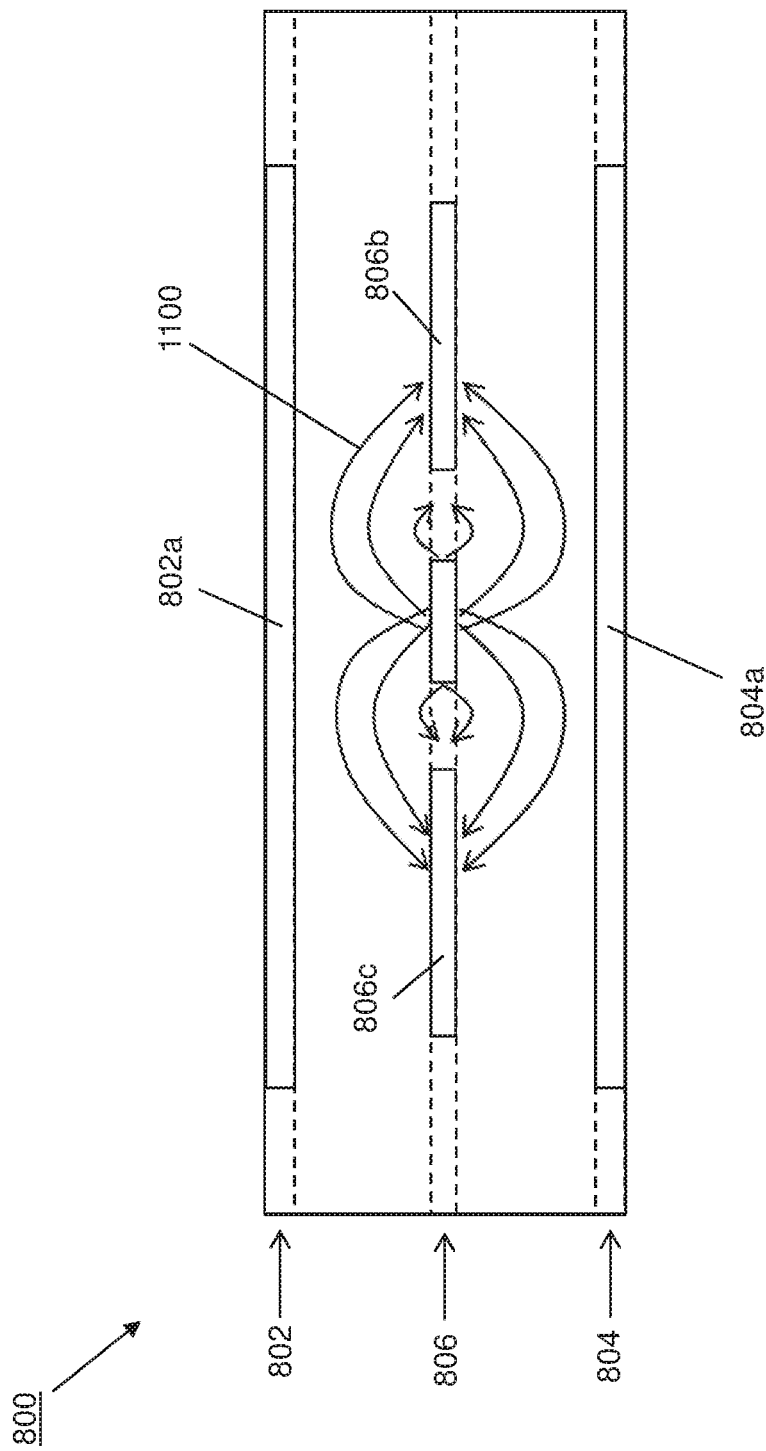

US 10,700,459 B1

CIRCUIT BOARD FLEX CABLE SYSTEM

BACKGROUND

The present disclosure relates generally to information handling systems, and more particularly to circuit board flex cables used in information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems typically include subsystems that must be connected together. With the increasing desire to provide a variety of functionality in a small form factor, such connections are often required in three dimensions (e.g., with connectors that are off-axis relative to each other) and necessitate connector systems that provide some degree of mechanical compliance. Twin-axial (twinax) cabling is one option for providing such connections, but twinax cables tend to take up a relatively large amount of space and can block airflow through the system chassis, resulting in thermal issues. Flex cabling can solve the issues associated with twinax cabling, as flex cabling can be shaped in a manner that prevents the blocking of airflow discussed above, while providing benefits associated with the many signal lines that can be routed in layer(s) of the flex cabling. However, flex cabling often includes connectors on either ends that are connected to the signal line(s), and those connectors produce degradations in the signal integrity of the signals transmitted via the flex cable. In order to address signal degradation issues, flex cabling may be integrated with a circuit board, thus removing the connector that would otherwise be needed to connect to that circuit board. However, the inventors of the present disclosure have discovered that conventional techniques for integrating flex cables with circuit boards produces an impedance discontinuity where the flex cable terminates in the circuit board, resulting in an impedance droop in signals sent via the flex cable to the circuit board. Such impedance droops negatively effect signal integrity, and provide a less than optimal high speed interface via the flex cable.

Accordingly, it would be desirable to provide an improved circuit board flex cable system.

SUMMARY

According to one embodiment, an Information Handling System (IHS) includes a processing system; a circuit board that is coupled to the processing system; a flex cable that extends from the circuit board; a data transmission stack that extends through the flex cable and the circuit board, wherein the data transmission stack includes: a first ground layer that extends along the length of the data transmission stack and that includes a first grounding element that is coupled to ground; a second ground layer that extends along the length of the data transmission stack, that is spaced part from the first ground layer, and that includes a second grounding element that is coupled to ground; a signal layer that extends along the length of the data transmission stack, that is located between the first ground layer and the second ground layer, and that includes a signal element that is configured to transmit a signal; and a third grounding element and extends along a length of the data transmission stack adjacent to a termination of the flex cable in the circuit board, that is provided in the signal layer adjacent the signal element, and that is coupled to ground.

BRIEF DESCRIPTION OF THE DRAWINGS

FIG. 11A is a cross sectional view illustrating an embodiment of relatively strong electric field components produced by the data transmission stack of FIG. 8A transmitting a signal in the circuit board flex cable system of FIG. 3.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
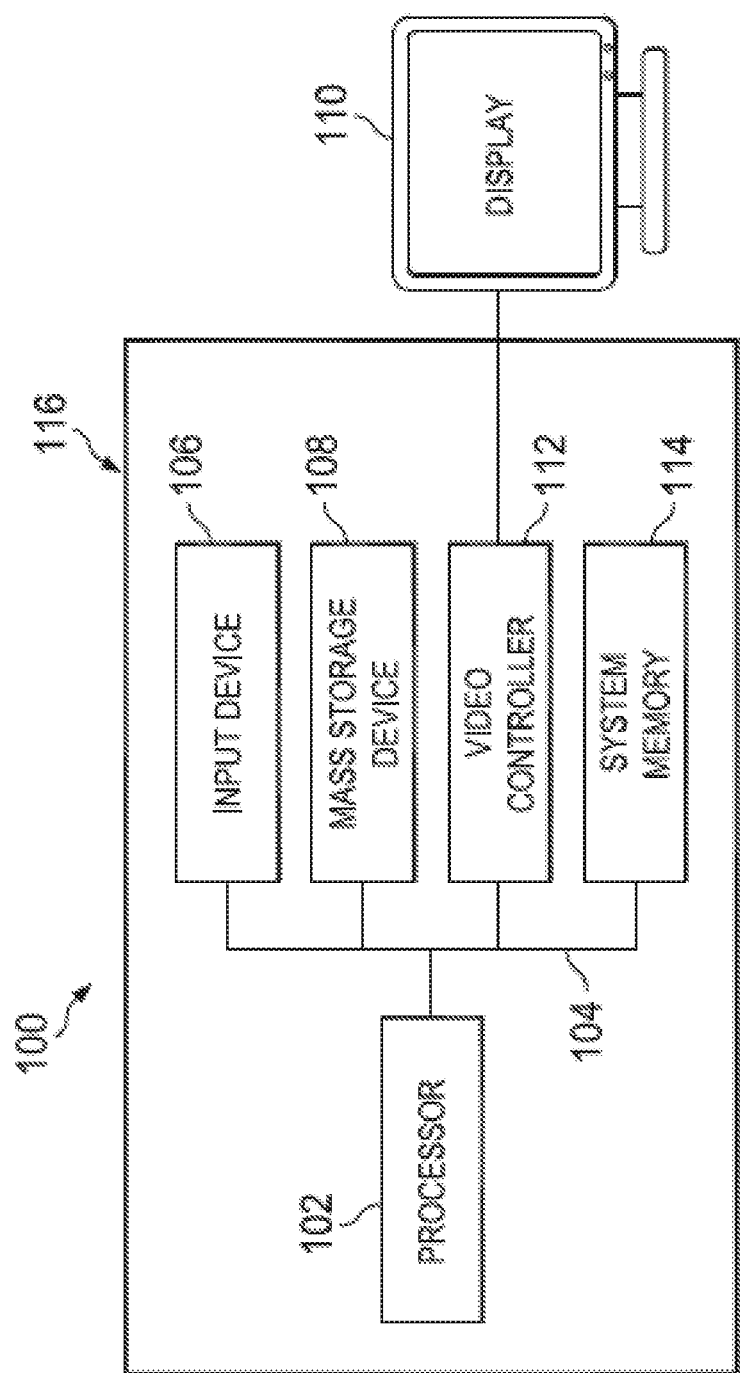
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
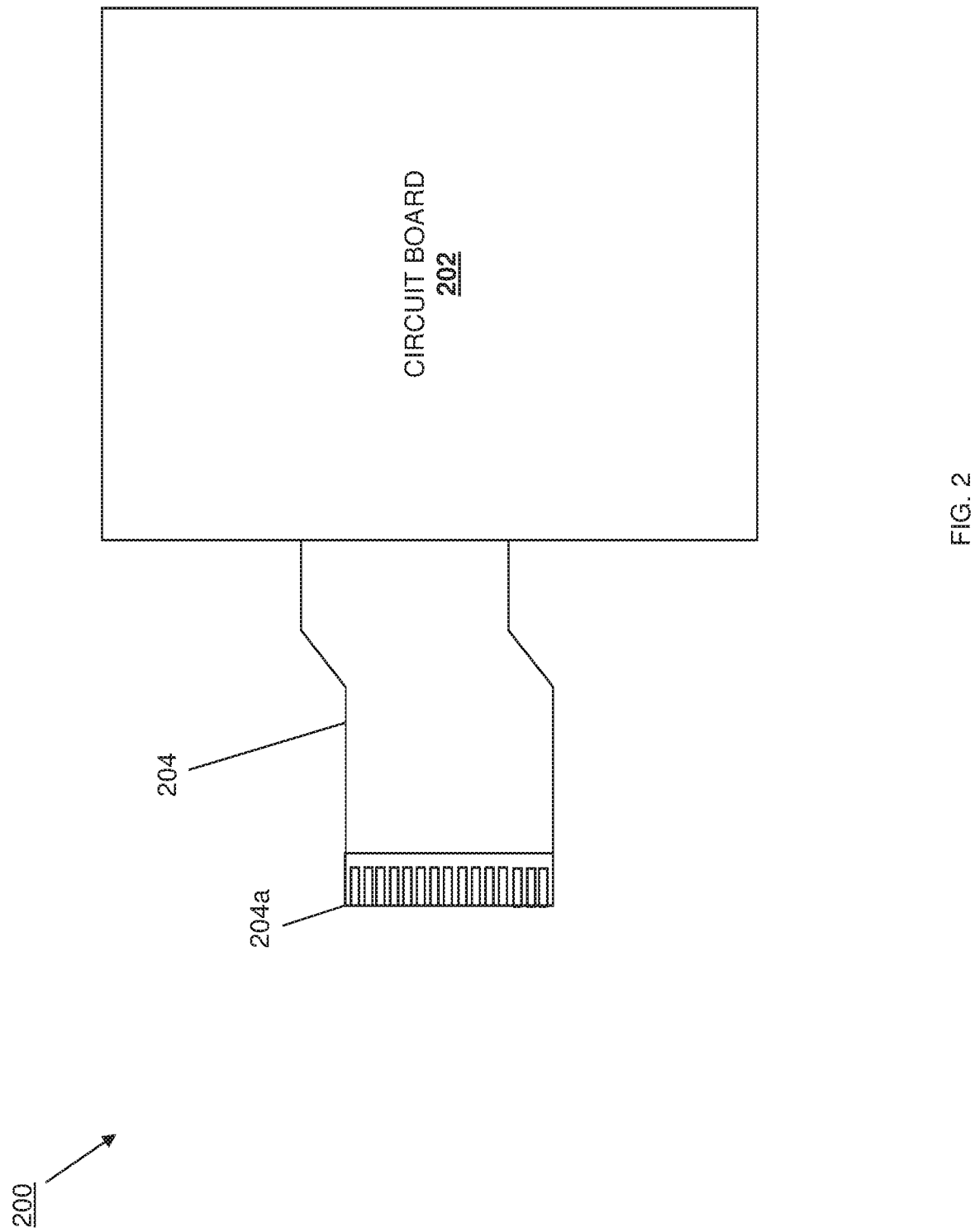
FIG. 2 is a top view illustrating an embodiment of a circuit board flex cable system.

Referring now to FIG. 2, an embodiment of a circuit board flex cable system 200 is illustrated. In the illustrated embodiment, the circuit board flex cable system 200 includes a circuit board 202 that, as discussed above, may be provided by a Printed Circuit Board (PCB) material and may include a plurality of layers that may include the grounding elements and signal elements discussed below, the vias extending through the plurality of layers discussed below, and/or any other PCB elements that would be apparent to one of skill in the art in possession of the present disclosure. While not illustrated, one of skill in the art in possession of the present disclosure will recognize that the circuit board 202 may include or be coupled to a processing system (e.g., including the processor 102 discussed above with reference to FIG. 2) while remaining within the scope of the present disclosure. A flex cable 204 extends from an edge of the circuit board 202. In the illustrated embodiment, the flex cable 204 is provided by a flexible flat cable that may include a flat and flexible base material with multiple layers that may include the grounding elements and signal elements discussed below, and/or any other flex cable elements that would be apparent to one of skill in the art in possession of the present disclosure.

As would be understood by one of skill in the art in possession of the present disclosure, flex cables such as the flexible flat cable illustrated in FIG. 2 may be used in place of cylindrical cabling in order to provide enhanced cable management, particularly in relatively high-flex applications, as flexible flat cables typically utilize less space than cylindrical cabling, offer increased Electro-Magnetic Interference/Radio Frequency Interference (EMI/RFI) suppression, reduce wire-coupling issues, are lighter in weight, and/or provide a variety of other benefits that would be apparent to one of skill in the art in possession of the present disclosure. In the illustrated embodiment, the end of the flex cable 204 that is opposite the flex cable 204 from the circuit board 202 includes a connector 204a that, as discussed below, may be configured to connect the flex cable 204 and circuit board 202 to another circuit board (e.g., via engagement of the connector 204a and a connector coupling on that circuit board.) As such, one of skill in the art in possession of the present disclosure will recognize that the connector 204a on the flex cable 204 may couple the circuit board 202 to a processing system (e.g., including the processor 102 discussed above with reference to FIG. 2) included on or coupled to another circuit board while remaining within the scope of the present disclosure. However, while a specific circuit board flex cable system 200 is illustrated in FIG. 2, one of skill in the art in possession of the present disclosure will recognize that flex cable systems may have a variety of components (e.g., different circuit boards, different flex cables, etc.) and/or component configurations while remaining within the scope of the present disclosure.

Figure 3:
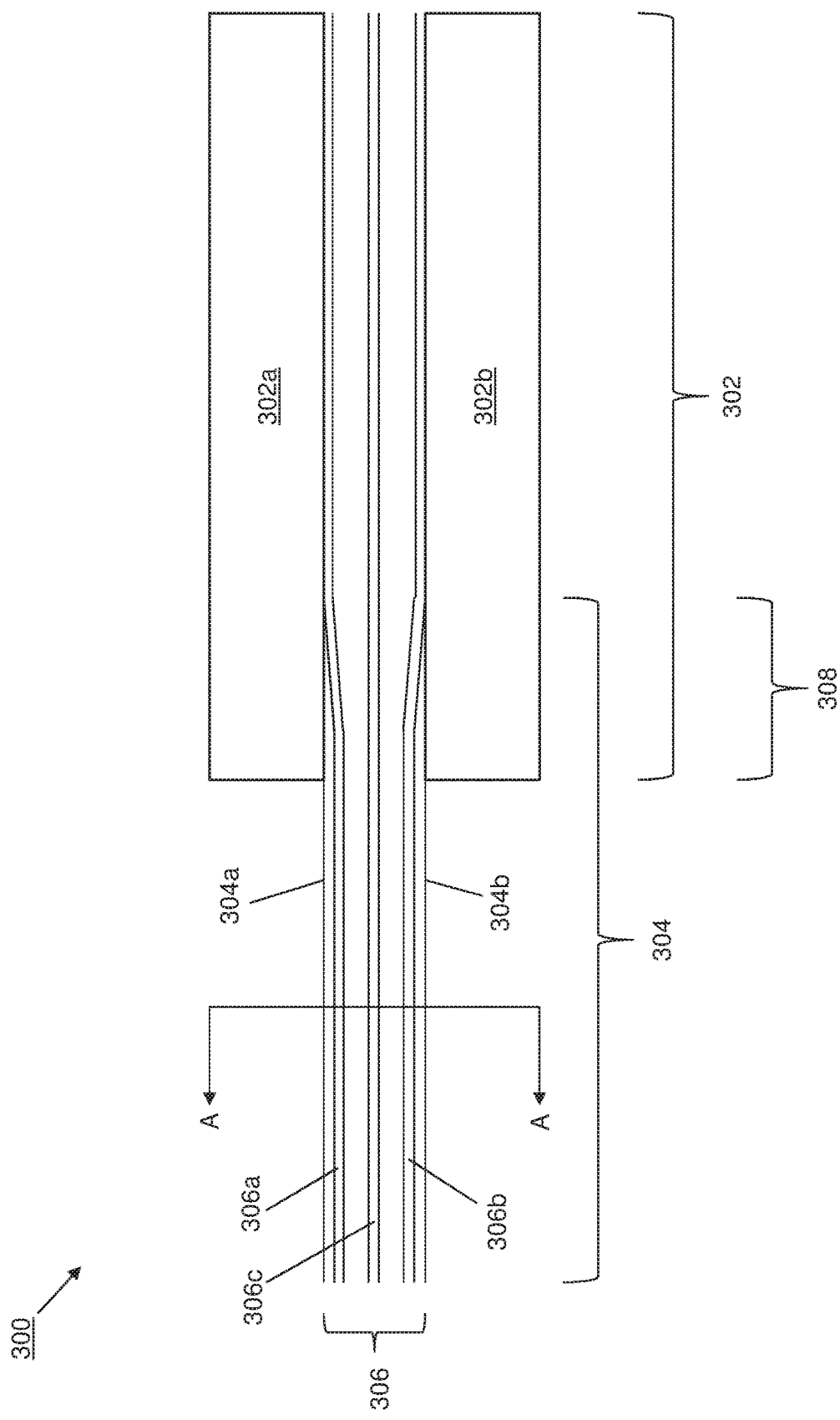
FIG. 3 is a cross-sectional side view illustrating an embodiment of a circuit board flex cable system.

Referring now to FIG. 3, an embodiment of a circuit board flex cable system 300 is illustrated that may be the circuit board flex cable system 200 of FIG. 2. In the illustrated embodiment, the conventional circuit board flex cable system 300 includes a circuit board 302 (which may be the circuit board 202 of FIG. 2), a flex cable 304 (which may be the flex cable 204 of FIG. 2) that extends from the circuit board 202, and a data transmission stack 306 that extends through the flex cable 304 and the circuit board 302. Furthermore, FIG. 3 illustrates how a flex cable/circuit board transition section 308 is provided in the circuit board flex cable system 300 where the flex cable 304 terminates in the circuit board 304. For example, in FIG. 3, the circuit board 302 is illustrated as including a first board portion 302a and a second board portion 302b located on opposite sides of the data transmission stack 306, while the flex cable 304 is illustrated as including a first flex cable portion 304a and a second flex cable portion 304b located on opposite sides of the data transmission stack 306. As can be seen in FIG. 3, in the flex cable/circuit board transition section 308, the first flex cable portion 304a and the second flex cable portion 304b provided on the flex cable 304 engage the first board portion 302a and a second board portion 302b, respectively, of the circuit board 302, and reduce in thickness such that the first flex cable portion 304a and a second flex cable portion 304b provided on the flex cable 304 do not extend past the flex cable/circuit board transition section 308 and further into the circuit board 302.

Furthermore, the data transmission stack 306 includes a first ground layer 306a that extends along the length of the data transmission stack 306 and that is located immediately adjacent the first flex cable portion 304a on the flex cable 304 (i.e., for the section of the flex cable 304 that is outside of the flex cable/circuit board transition section 308), immediately adjacent the first flex cable portion 304a and opposite the first flex cable portion 304a from the first board portion 302a in the flex cable/circuit board transition section 308, and immediately adjacent the first board portion 302a of the circuit board 302 (i.e., for the section of the circuit board 302 that is outside of the flex cable/circuit board transition section 308). Similarly, the data transmission stack 306 includes a second ground layer 306b that extends along the length of the data transmission stack 306 and that is located immediately adjacent the second flex cable portion 304b on the flex cable 304 (i.e., for the section of the flex cable 304 that is outside of the flex cable/circuit board transition section 308), immediately adjacent the second flex cable portion 304b and opposite the second flex cable portion 304b from the second board portion 302b in the flex cable/circuit board transition section 308, and immediately adjacent the second board portion 302b of the circuit board 302 (i.e., for the section of the circuit board 302 that is outside of the flex cable/circuit board transition section 308). Finally, the data transmission stack 306 includes a signal layer 306c that extends along the length of the data transmission stack 306 and that is located between (and spaced apart from) each of the first ground layer 306a and the second ground layer 306b in each of the flex cable 304, the circuit board 304, and the flex cable/circuit board transition section 308 that includes both the flex cable 304 and the circuit board 302.

While a specific circuit board flex cable system 300 has been illustrated, one of skill in the art in possession of the present disclosure will recognize that circuit board flex cable systems may have other components and/or component configurations while remaining within the scope of the present disclosure. For example, as discussed below, the circuit board 302 may (and typically will) include other data transmission stacks, other layers, vias, and/or other circuit board features while still benefiting from the teachings of the present disclosure. Similarly, the flex cable 304 may include other data transmission stacks, other layers, and/or other flex cable features while still benefiting from the teachings of the present disclosure.

Figure 4:
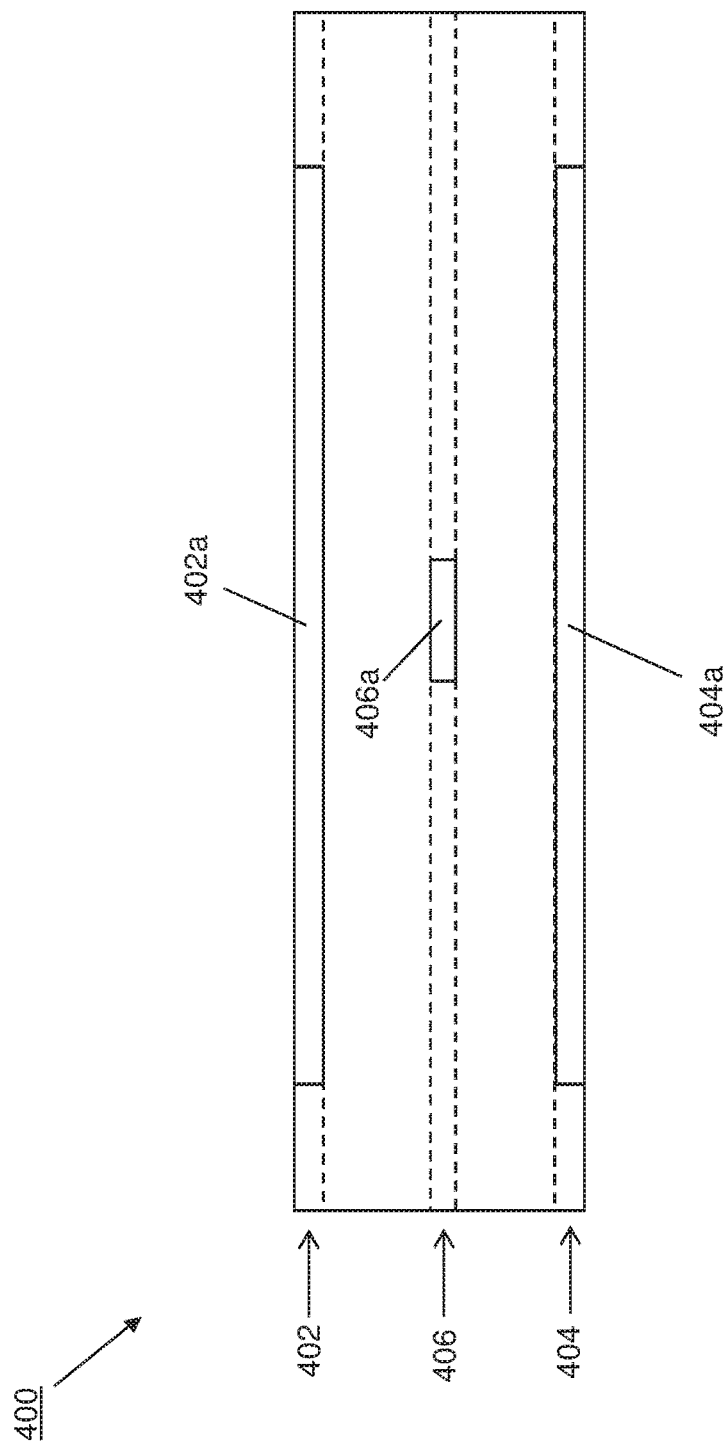
FIG. 4 is a cross section view illustrating an embodiment of a conventional data transmission element that may be provided in the circuit board flex cable system of FIG. 3.

Referring now to FIG. 4, an embodiment of a conventional data transmission stack 400 is illustrated as viewed along the cross section A illustrated in FIG. 3 when provided in the circuit board flex cable system 300 of FIG. 3. As illustrated in FIG. 4, the conventional data transmission stack 400 includes a first ground layer 402 (which may be the first ground layer 306a in the data transmission stack 306 discussed above with reference to FIG. 3) having a first grounding element 402a that, as discussed below, extends along at least a portion of the data transmission stack 400 and that is configured to couple to ground (e.g., via a ground connection in a circuit board.) The conventional data transmission stack 400 also includes a second ground layer 404 (which may be the second ground layer 306b in the data transmission stack 306 discussed above with reference to FIG. 3) that is spaced apart from the first ground layer 402 and that includes a second grounding element 404a that, as discussed below, extends along at least a portion of the data transmission stack 400 and that is configured to couple to ground (e.g., via a ground connection in a circuit board.) The conventional data transmission stack 400 also includes a signal layer 406 (which may be the signal layer 306c in the data transmission stack 306 discussed above with reference to FIG. 3) that is located between and spaced apart from the first ground layer 402 and the second ground layer 404, and that includes a signal element 406a that, as discussed below, extends along the length of the data transmission stack 400. While a specific conventional data transmission stack 400 has been illustrated, one of skill in the art in possession of the present disclosure will recognize that conventional data transmission stacks may have other components and/or component configurations while remaining within the scope of the present disclosure. For example, as discussed below, conventional data transmission stacks may include a variety of layers provided using different materials while remaining within the scope of the present disclosure.

Figure 5:
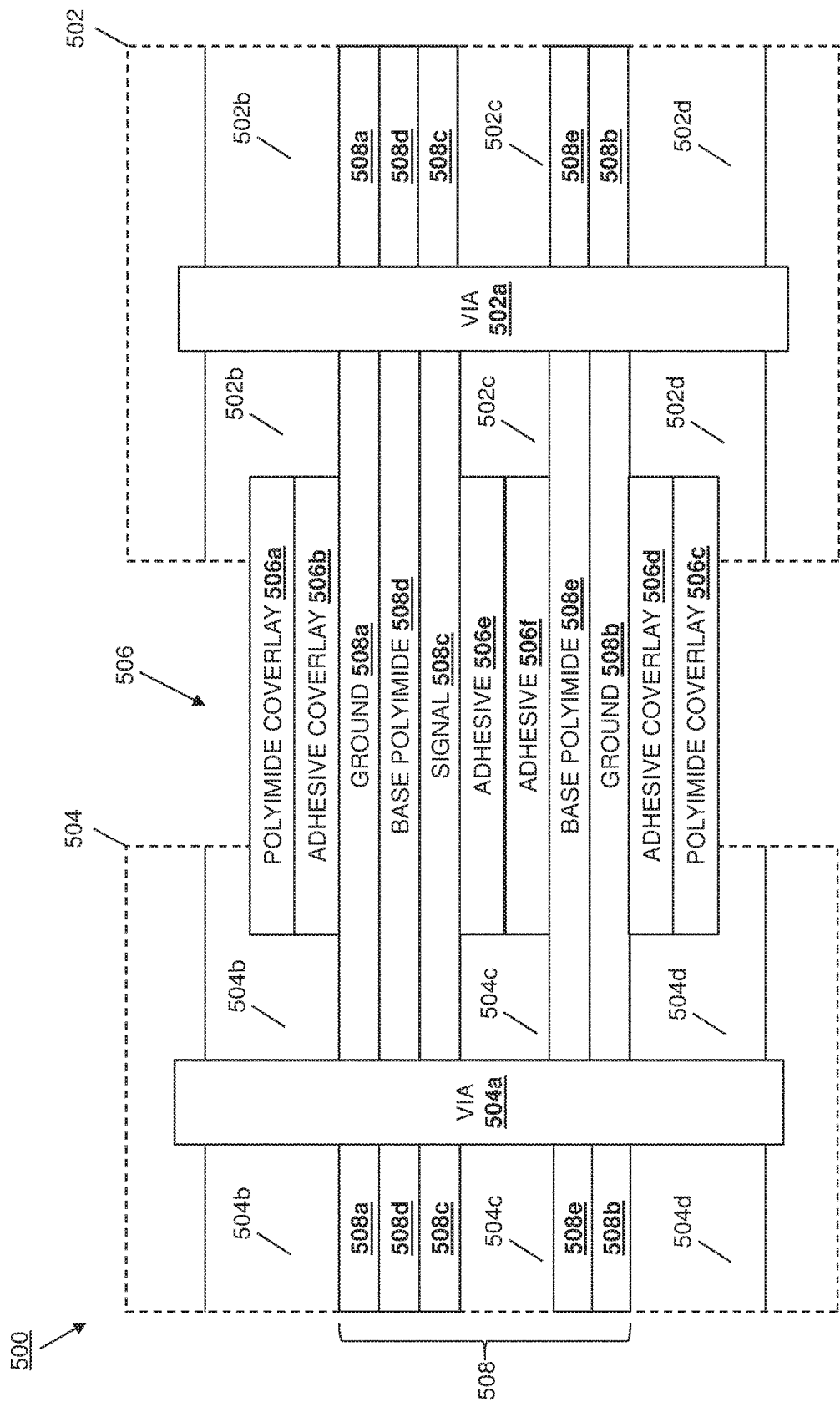
FIG. 5 is a schematic view illustrating an embodiment of a conventional circuit board flex cable system provided by the circuit board flex cable system of FIG. 3 and the conventional data transmission stack of FIG. 4.

Referring now to FIG. 5, an embodiment of a conventional circuit board flex cable system 500 is illustrated. In the illustrated embodiment, the conventional circuit board flex cable system 500 includes a first circuit board 502 coupled to a second circuit board 504 by a flex cable 506, with a data transmission stack 508 extending through the first circuit board 502, the flex cable 506, and the second circuit board 504. For example, the first circuit board 502 may be the circuit board 202 of FIG. 2 and/or the circuit board 302 of FIG. 3, the flex cable 506 may be the flex cable 204 of FIG. 2 and/or the flex cable 304 of FIG. 3 and may be connected to the second circuit board 504 via the connector 204a of FIG. 2, and the data transmission stack 508 may be the data transmission stack 306 of FIG. 3 and/or the data transmission stack 400 of FIG. 4. The first circuit board 502 includes a via 502a that, in the embodiments discussed below, is connected to ground, as well as a plurality of pre-impregnated ("prepreg") layers 502b, 502c, and 502d. Similarly, the second circuit board 504 includes a via 504a that, in the embodiments discussed below, is connected to ground, as well as a plurality of prepreg layers 504b, 504c, and 504d. As would be understood by one of skill in the art in possession of the present disclosure, prepreg layers in a circuit board may be provided using a base material (e.g., carbon, fiberglass, Kevlar, etc.) that is pre-impregnated with a resin (e.g., an epoxy-based resin.)

The flex cable 506 includes a polyimide coverlay layer 506a and an adhesive coverlay layer 506b that may provide the first flex cable portion 304a of the flex cable 300 described above with reference to FIG. 3, as well as a polyimide coverlay layer 506c and a adhesive coverlay layer 506d that may provide the second flex cable portion 304b of the flex cable 300 described above with reference to FIG. 3. As would be understood by one of skill in the art in possession of the present disclosure, polyimide film may be used in flex cable construction to provide the polyimide coverlay layer 506c, with the adhesive coverlay layer 506d used to adhere the polyimide coverlay layer 506c to ground elements. The data transmission stack 508 that is provided through the first circuit board 502, the second circuit board 504, and the flex cable 506 includes a ground layer 508a that may be the first ground layer 306a of FIG. 3 and/or the first ground layer 402 of FIG. 4, and thus may include the grounding element 402a which may couple to ground through engagement with either of the vias 502a and 504a.

The data transmission stack 508 that is provided through the first circuit board 502, the second circuit board 504, and the flex cable 506 also includes a ground layer 508b that may be the second ground layer 306b of FIG. 3 and/or the second ground layer 404 of FIG. 4, and thus may include the grounding element 404a which may couple to ground through engagement with either of the vias 502a and 504a. The data transmission stack 508 that is provided through the first circuit board 502, the second circuit board 504, and the flex cable 506 also includes a signal layer 508c that may be the signal layer 306c of FIG. 3 and/or the signal layer 406 of FIG. 4, and thus may include the signal element 406a. In the data transmission stack 508 that is provided through the first circuit board 502, the second circuit board 504, and the flex cable 506, a base polyimide layer 508d is provided between the ground layer 508a and the signal layer 508c, and a base polyimide layer 508e is provided immediately adjacent the ground layer 508b. The flex cable 506 includes a pair of adhesive layers 506e and 506f that are provided between the signal layer 508c and the base polyimide layer 508a in the portion of the data transmission stack 508 that is provided through the flex cable 506, with each of those adhesive layers 506e and 506f located immediately adjacent the prepreg layer 502c in the first circuit board 502 and the prepreg layer 504c in the second circuit board 504. As would be understood by one of skill in the art in possession of the present disclosure, the base polyimide layer 508d may be provided between a first ground element and a signal element, the base polyimide layer 508a may be provided adjacent a second ground element, and the adhesive layers 506e and 506f may adhere the signal element to the base polyimide layer 508e to provide a flex circuit with three conductive layers (and the coverlay laminated on opposite sides of the flex circuit for protection.

As such, FIG. 5 illustrates how the signal layer 508c (and the signal element in that signal layer 508c) are located immediately adjacent the adhesive layers 506e and 506f in the flex cable 506, and how those adhesive layers 506e and 506f are replaced by the prepreg layers 502c and 504c when the flex cable 506 terminates in the first circuit board 502 and the second circuit board 504. It has been found that this transition from adhesive layers to prepreg layers results in an impedance droop associated with signal being transmitted via the signal element in the signal layer 508c adjacent the termination of the flex cable 506 in the circuit boards 502/504. For example, with reference to FIG. 3, it can be seen that the flex cable/circuit board transition section 308 of the circuit board flex cable system 300 provides dimensional changes in the data transmission stack 306 that result in a reduced impedance, which has been found to be primarily a result of the return current through the ground layers 306a and 306b. This is thought to be a result of the impedance of the signal element in the signal layer 306c being a strong function of a dielectric thickness between the signal element in the signal layer 306c and the grounding elements in the first ground layer 306a and the second ground layer 306b (as well as a strong function of the dielectric constant). As such, when that dielectric thickness changes in the flex cable/circuit board transition section 308, the impedance changes as well. While such impedance issues could be avoided by not terminating the flex cable 304 at the edge of the circuit board 302 (i.e., extending the flex cable 304 through the circuit board 302 as long as the data transmission stack 306 is needed), such terminations reduce the costs of manufacturing the circuit board flex cable system 300 by replacing the relatively high cost flex cable materials with the relatively low cost circuit board materials.

Figure 6:
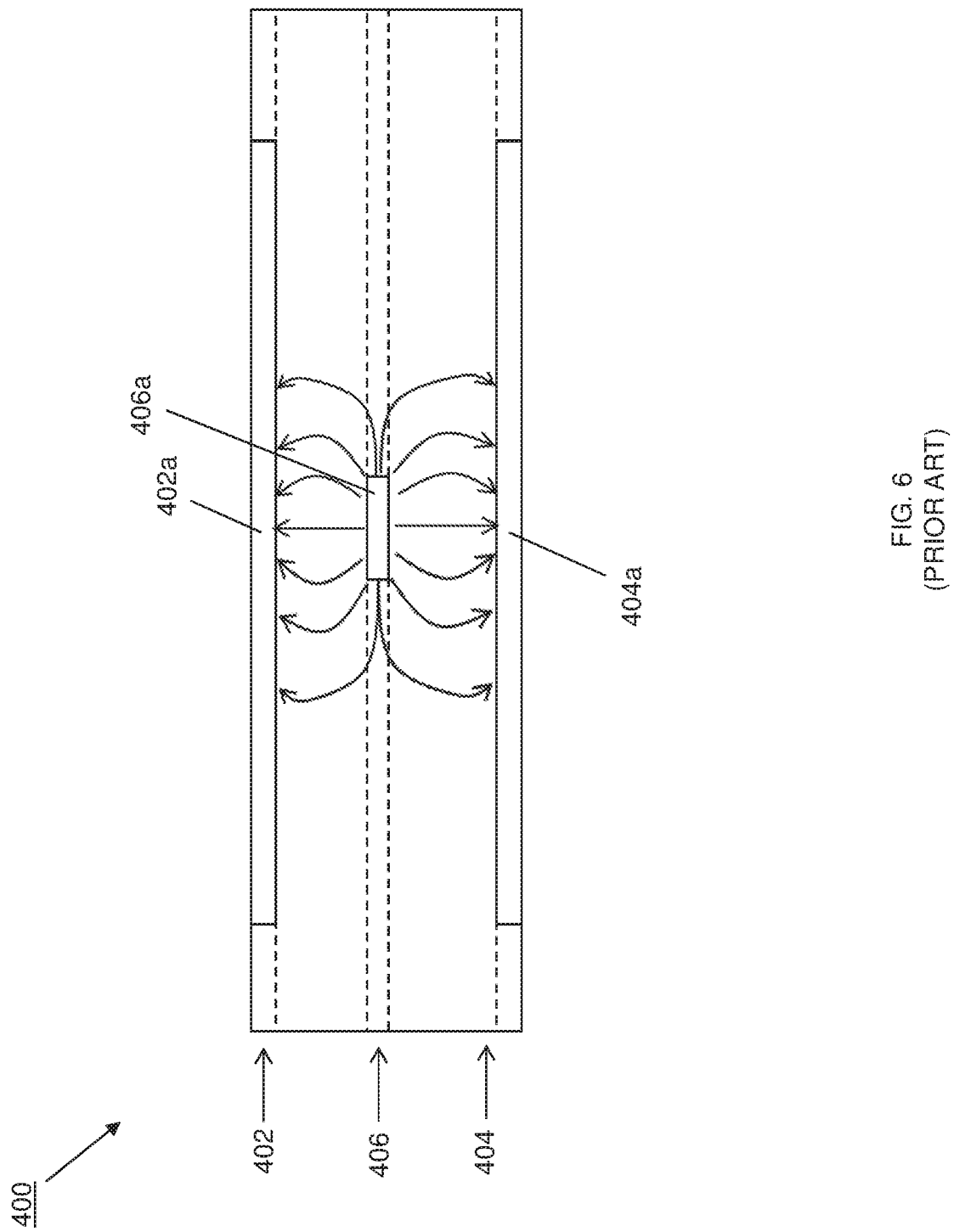
FIG. 6 is a cross sectional view illustrating an embodiment of electric field components produced by the conventional data transmission stack of FIG. 4 transmitting a signal in the circuit board flex cable system of FIG. 3.

Referring now to FIG. 6, an embodiment of electric field components produced when the conventional data transmission stack of FIG. 4 transmits a signal in the circuit board flex cable system of FIG. 3 is illustrated. As can be seen in FIG. 6, when a signal is transmitted via the signal element 406a in the signal layer 406, an electric field is generated that includes relatively strong electric field components that initiate at the signal element 402 and terminate at each of the first grounding element 402a in the first ground layer 402 and the second grounding element 404a in the second ground layer 404. One of skill in the art in possession of the present disclosure will recognize that the impedance produced via such signal transmissions is mainly the function of inductance and capacitance of the illustrated area of the data transmission stack, and therefore is a function of the geometry and material of that area. As such, when either the geometry or material of that area changes (as with the termination of the flex cable in the circuit board, the electric field will also change along with that impedance.

Figure 7A:
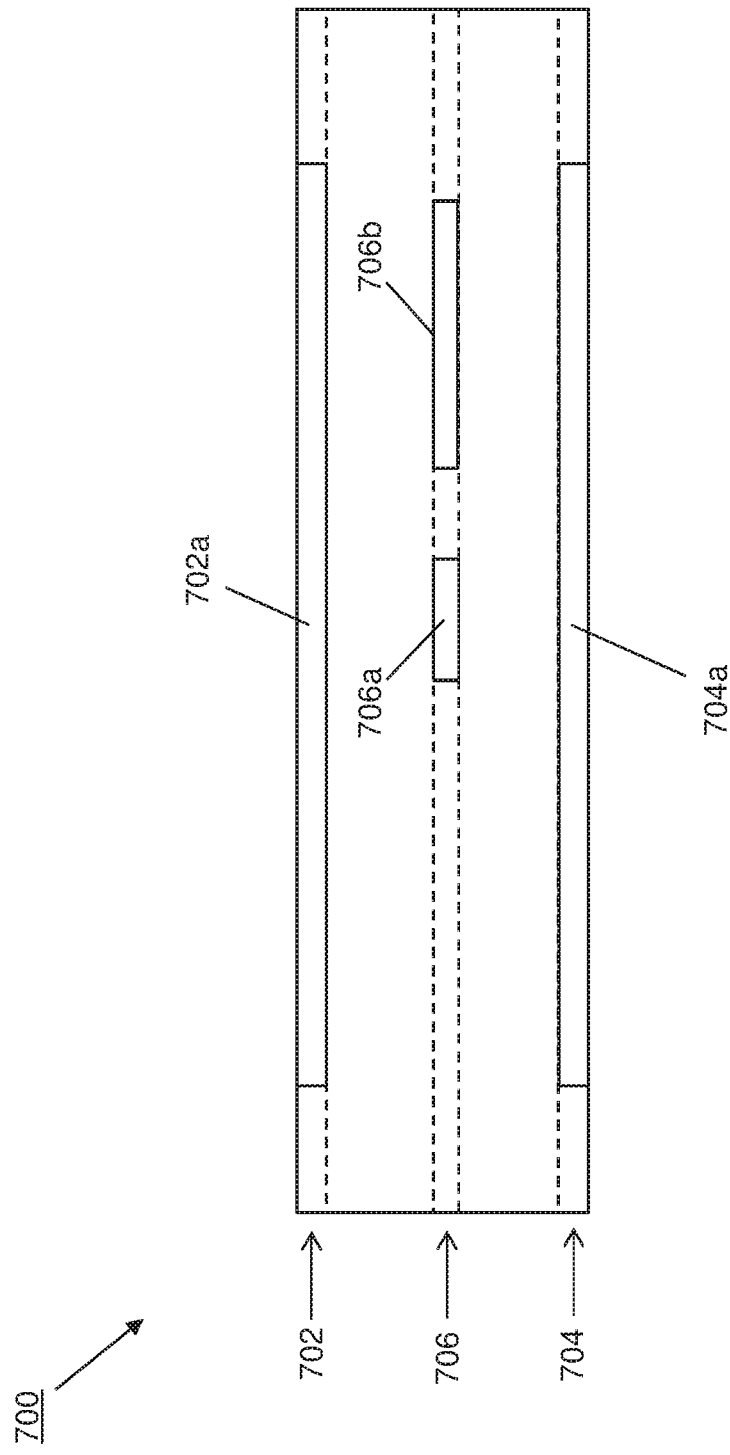
FIG. 7A is a cross section view illustrating an embodiment of a data transmission stack provided according to the teachings of the present disclosure and included in the circuit board flex cable system of FIG. 3.
Figure 7B:
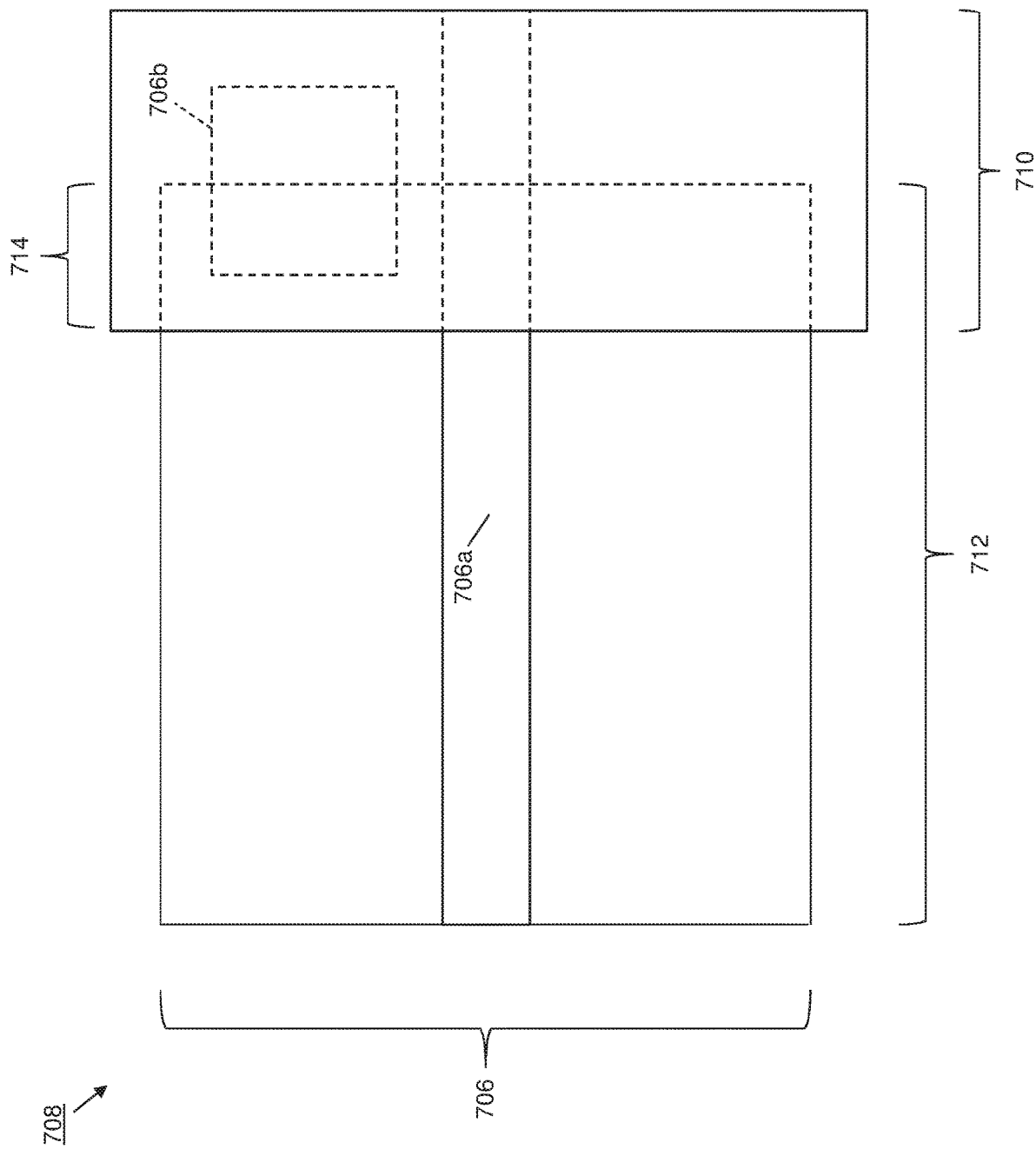
FIG. 7B is a top view illustrating an embodiment of the circuit board flex cable system of FIG. 3 including the data transmission stack of FIG. 7A.

Referring now to FIGS. 7A and 7B, a data transmission stack 700 is illustrated that is provided according to the teachings of the present disclosure and that has been found to reduce the issues associated with the conventional data transmission stacks discussed above. The embodiment of a data transmission stack 700 may be provided in the circuit board flex cable system 300 of FIG. 3, and is illustrated in FIG. 7A as being viewed along the cross section A illustrated in FIG. 3. As illustrated in FIG. 7A, the data transmission stack 700 includes a first ground layer 702 (which may be the first ground layer 306a in the data transmission stack 306 discussed above with reference to FIG. 3) having a first grounding element 702a that, as discussed below, extends along at least a portion of the data transmission stack 700 and that is configured to couple to ground (e.g., via a ground connection in a circuit board.) The data transmission stack 700 also includes a second ground layer 704 (which may be the second ground layer 306b in the data transmission stack 306 discussed above with reference to FIG. 3) that is spaced apart from the first ground layer 702 and that includes a second grounding element 704a that, as discussed below, extends along at least a portion of the data transmission stack 700 and that is configured to couple to ground (e.g., via a ground connection in a circuit board.) The data transmission stack 700 also includes a signal layer 706 (which may be the signal layer 306c in the data transmission stack 306 discussed above with reference to FIG. 3) that is located between and spaced apart from the first ground layer 702 and the second ground layer 704, and that includes a signal element 706a that, as discussed below, extends along the length of the data transmission stack 700.

The data transmission stack 700 also includes a third grounding element 706b that is included in the signal layer 706 that is spaced apart from the signal element 706a (as well as located between and spaced apart from the first ground layer 702 and the second ground layer 704.) While not illustrated in FIG. 7A, the third grounding element may be coupled to ground in a substantially similar manner as the grounding elements discussed above (e.g., through a ground via in the circuit board 710.) With reference to FIG. 7B, a circuit board flex cable system 708 is illustrated that includes a circuit board 710 (which may be the circuit board 302 of FIG. 3), a flex cable 712 (which may be the flex cable 304 of FIG. 3), and a flex cable/circuit board transition section 714 (which may be the flex cable/circuit board transition section 308 of FIG. 3). In particular, FIG. 7B illustrates the data transmission stack 700 provided via the circuit board 710 and flex cable 712 in the circuit board flex cable system 708, with only the signal layer 706 of the data transmission stack 700 visible in FIG. 7B.

As can be seen, the third grounding element 706b is spaced apart from the signal element 706a in the signal layer 706, and extends between the flex cable 712 and the circuit board 710 for a relatively short length of the data transmission stack 700 that is provided across an edge of the flex cable/circuit board transition section 714. In experimental embodiments, the inventors of the present disclosure have found that the third grounding element 706b need only be provided along a length of the signal layer 706 (i.e., from left-to-right in FIG. 7B) in the data transmission stack 700 that is adjacent to the termination of the flex cable 712 in the circuit board 710, and may extend for some length on either side of the termination of the flex cable 712 in the circuit board 710 to ensure the functionality discussed below. For example, one of skill in the art in possession of the present disclosure will recognize that the third grounding element 706b should be tightly coupled to the signal element 706a in order for the third grounding element 706b to become the primary ground reference for the signal element 706a. While there will still be coupling of electric fields between the signal element 706a and the first and second grounding elements 702a and 704a, it will not be as significant as the coupling illustrated in FIG. 6. One of skill in the art in possession of the present disclosure will recognize the spacing between the third grounding element the signal element 706a needed in order to make the third grounding element 706b the primary ground reference for the signal element 706a, and will recognize that the signal element 706a and the third grounding element 706b may run parallel as long as possible (e.g., from the connection of the signal element 706a to a via or another layer in the circuit board, the termination of the signal element 706a into a component, the connection of the third grounding element 706b to a via to connect to ground planes near the end of signal element 706a, etc.)

Figure 8A:
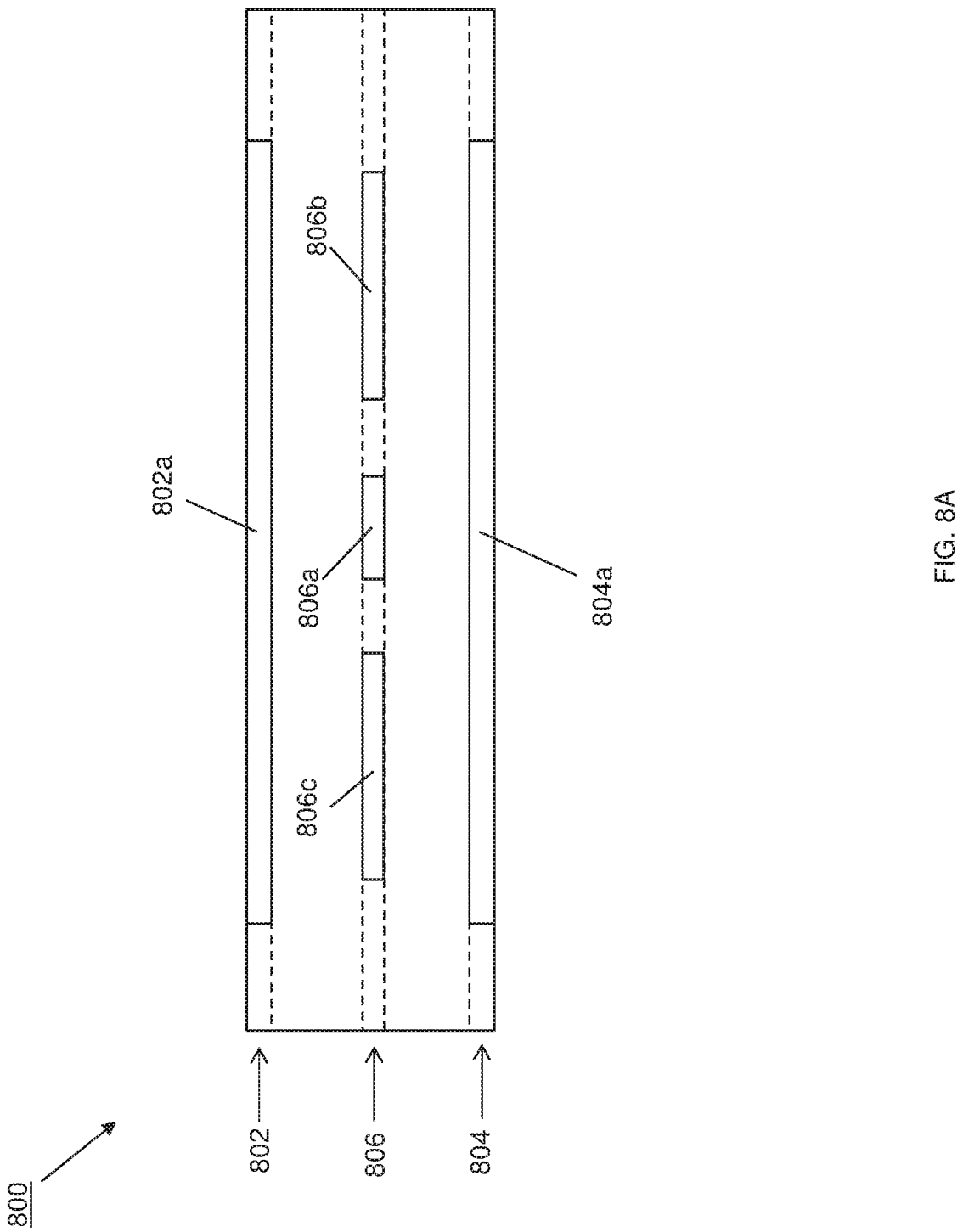
FIG. 8A is a cross section view illustrating an embodiment of a data transmission stack provided according to the teachings of the present disclosure and included in the circuit board flex cable system of FIG. 3.
Figure 8B:
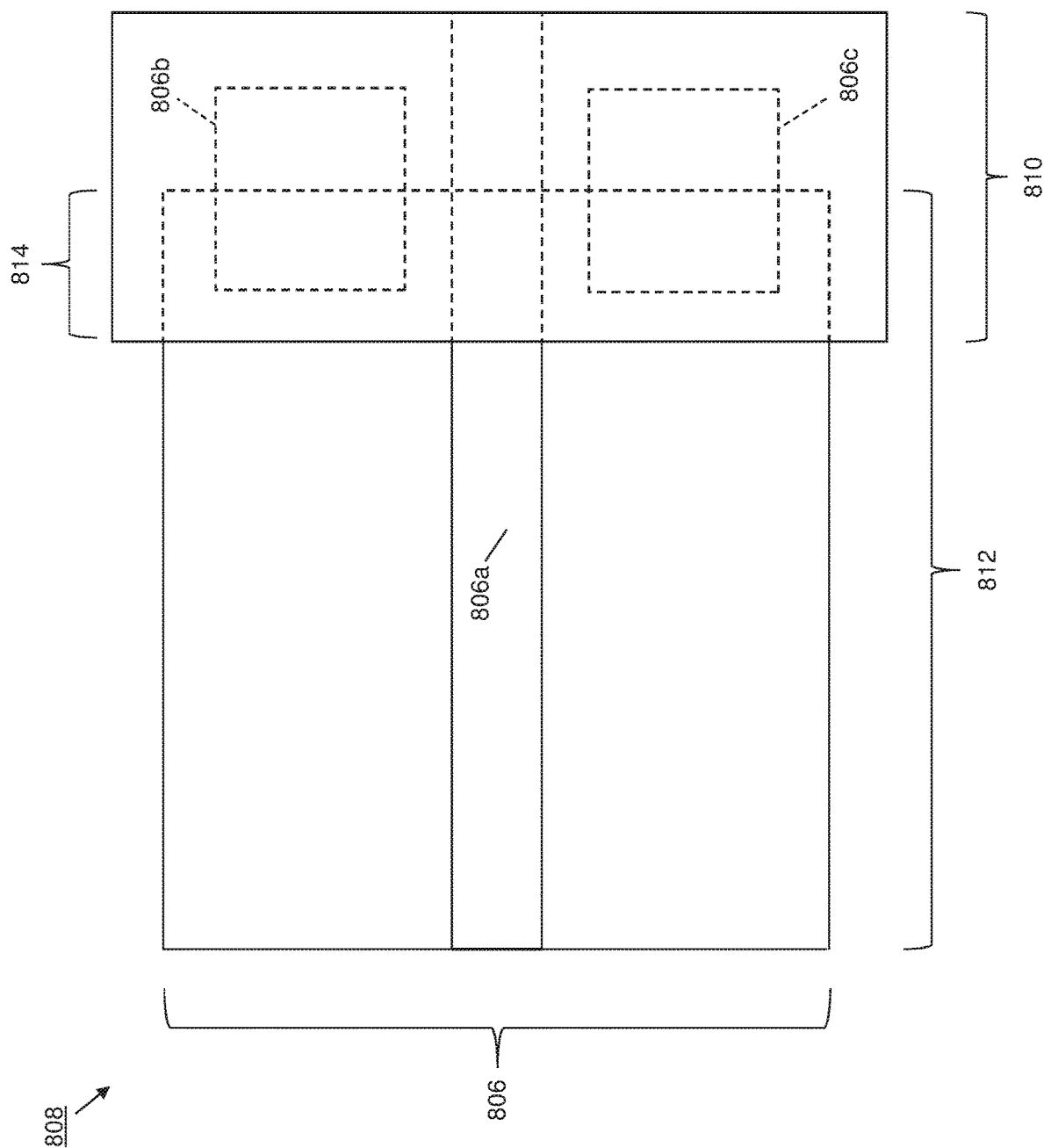
FIG. 8B is a top view illustrating an embodiment of the circuit board flex cable system of FIG. 3 including the data transmission stack of FIG. 8A.

Referring now to FIGS. 8A and 8B, another data transmission stack 800 is illustrated that is provided according to the teachings of the present disclosure and that has been found to reduce the issues associated with the conventional data transmission stacks discussed above. The embodiment of a data transmission stack 800 may be provided in the circuit board flex cable system 300 of FIG. 3, and is illustrated in FIG. 8 as being viewed along the cross section A illustrated in FIG. 3. As illustrated in FIG. 8, the data transmission stack 800 includes a first ground layer 802 (which may be the first ground layer 306a in the data transmission stack 306 discussed above with reference to FIG. 3) having a first grounding element 802a that, as discussed below, extends along at least a portion of the data transmission stack 800 and that is configured to couple to ground (e.g., via a ground connection in a circuit board.) The data transmission stack 800 also includes a second ground layer 804 (which may be the second ground layer 306b in the data transmission stack 306 discussed above with reference to FIG. 3) that is spaced apart from the first ground layer 802 and that includes a second grounding element 804a that, as discussed below, extends along at least a portion of the data transmission stack 800 and that is configured to couple to ground (e.g., via a ground connection in a circuit board.) The data transmission stack 800 also includes a signal layer 806 (which may be the signal layer 306c in the data transmission stack 306 discussed above with reference to FIG. 3) that is located between and spaced apart from the first ground layer 802 and the second ground layer 804, and that includes a signal element 806a that, as discussed below, extends along the length of the data transmission stack 800.

The data transmission stack 800 also includes a third grounding element 806b that is included in the signal layer 806 and that is spaced apart from the signal element 806a (as well as located between and spaced apart from the first ground layer 802 and the second ground layer 804), as well as a fourth grounding element 806c that is included in the signal layer 806 and that is spaced apart from the signal element 806a and located opposite the signal element 806a from the third grounding element 806a (as well as located between and spaced apart from the first ground layer 802 and the second ground layer 804). While not illustrated in FIG. 8A, the third grounding element 806b and the fourth grounding element 806c may be coupled to ground in a substantially similar manner as the grounding elements discussed above (e.g., through a ground via in the circuit board 810.) With reference to FIG. 8B, a circuit board flex cable system 808 is illustrated that includes a circuit board 810 (which may be the circuit board 302 of FIG. 3), a flex cable 812 (which may be the flex cable 304 of FIG. 3), and a flex cable/circuit board transition section 814 (which may be the flex cable/circuit board transition section 308 of FIG. 3). In particular, FIG. 8B illustrates the data transmission stack 800 provided via the circuit board 810 and flex cable 812 in the circuit board flex cable system 808, with only the signal layer 806 of the data transmission stack 800 visible in FIG. 8B.

As can be seen, the third grounding element 806b is spaced apart from the signal element 806a in the signal layer 806, and extends between the flex cable 812 and the circuit board 810 for a relatively short length of the data transmission stack 800 and across an edge of the flex cable/circuit board transition section 814. Similarly, the fourth grounding element 806c is spaced apart from the signal element 806a in the signal layer 806 and opposite the signal element 806a from the third grounding element 806b, and extends between the flex cable 812 and the circuit board 810 for a relatively short length of the data transmission stack 800 and across the edge of the flex cable/circuit board transition section 814. In experimental embodiments, the inventors of the present disclosure have found that the third grounding element 806b and the fourth grounding element 806c need only be provided along a length of the signal layer 806 (i.e., from left-to-right in FIG. 8B) in the data transmission stack 800 that is adjacent to the termination of the flex cable 812 in the circuit board 810, and may extend for some length on either side of the termination of the flex cable 812 in the circuit board 810 to ensure the functionality discussed below. The considerations for the length and location of the third grounding element 806b and the fourth grounding element 806c may be substantially similar to those discussed above for the third grounding element 706b of FIG. 7.

While specific data transmission stacks 700 and 800 have been illustrated, one of skill in the art in possession of the present disclosure will recognize that data transmission stacks provided according to the teachings of the present disclosure may have other components and/or component configurations while remaining within the scope of the present disclosure. For example, as discussed below, data transmission stacks may include a variety of layers provided using different materials while remaining within the scope of the present disclosure. Furthermore, the use of the data transmission stack 700 or the data transmission stack 800 in the circuit board flex cable system 300 may depend on space constraints, with the data transmission stack 700 utilized in systems with relatively lower amounts available space for providing the signal layer grounding element, and the data transmission stack 700 utilized in systems with relatively higher amounts of available space for providing the signal layer grounding elements.

Figure 9:
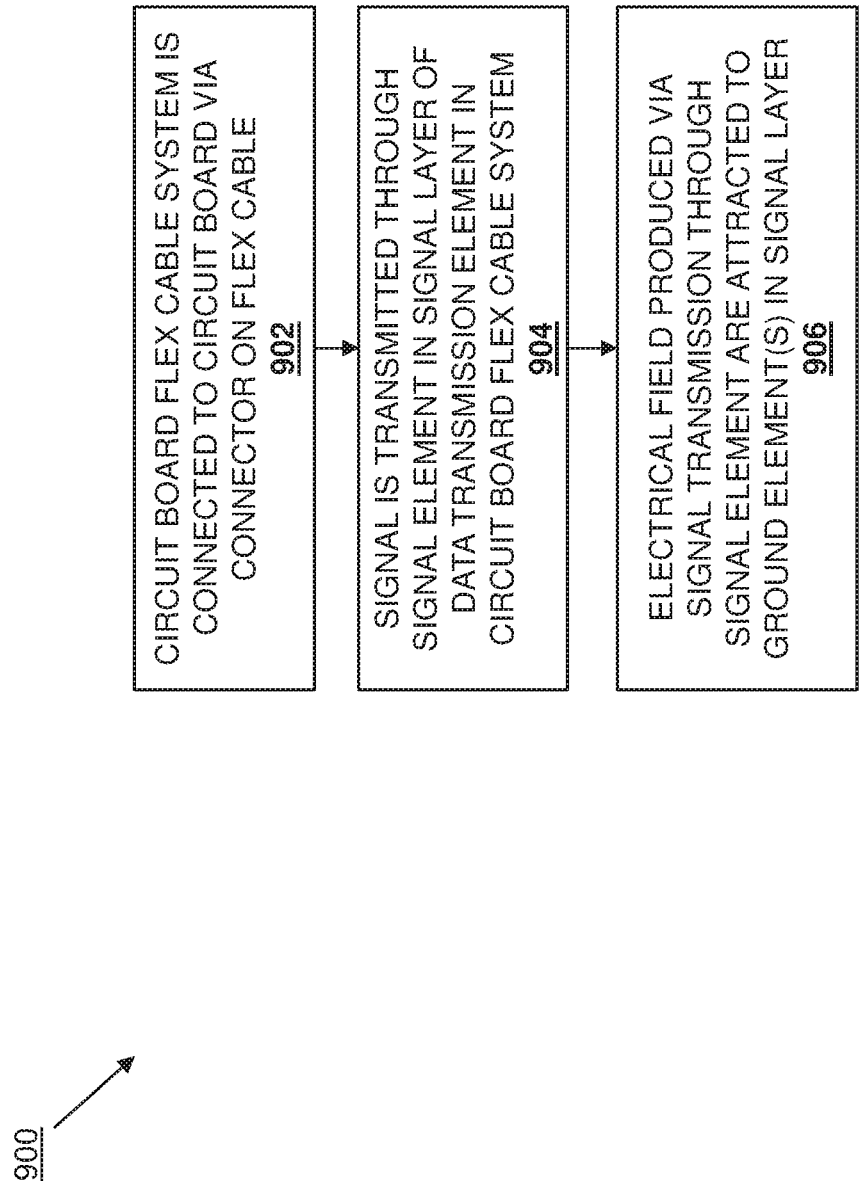
FIG. 9 is a flow chart illustrating an embodiment of a method for transmitting a signal in a circuit board flex cable system.

Referring now to FIG. 9, an embodiment of a method 900 for transmitting a signal in a circuit board flex cable system is illustrated. As discussed below, the systems and methods of the present disclosure provide for the transmission of signals via a signal element in a signal layer of a data transmission stack provided in a circuit board flex cable system without an associated impedance droop that occurs at the transition from the flex cable to the circuit board. The data transmission stack is provided with at least one signal layer grounding element in the signal layer adjacent the signal element, with the signal layer grounding element provided along a length of the data transmission stack that is located adjacent the transition of the flex cable to the circuit board, and the signal layer located between and spaced apart from first and second ground layers in the data transmission stack that each include a respective first and second grounding element. When signals are transmitted through the signal element, the relatively strong electric field components produced by those signals will be attracted to the signal layer grounding element in the signal layer where the flex cable transitions to the circuit board, rather than to the first and second grounding elements in the first and second ground layers, which operates to reduce or eliminate the impedance droop that would result if those relatively strong electric field components were attracted to the first and second grounding elements where the flex cable transitions to the circuit board. As such, cost effective circuit board flex cable systems that terminate the flex cable near the edge of the circuit board may be provided without the associated impedance droops that are produced in conventional circuit board flex cable systems.

The method 900 begins at block 902 where a circuit board flex cable system is connected to a circuit board via a connector on the flex cable. In an embodiment, at block 902, the connector 204*a* on the flex cable 204 extending from the circuit board 202 in the circuit board flex cable system 200 of FIG. 2 may be connected to another circuit board (e.g., via a connector that is compatible with the connector 204*a* and located on that circuit board.) As such, following block 902, two circuit boards may be connected by a flex cable in a manner substantially similar to the first circuit board 502 and the second circuit board 504 via the flex cable 506 in the conventional circuit board flex cable system 500 of FIG. 5. In the examples discussed below, the circuit board flex cable system 300 is coupled to a circuit board (not illustrated) via the flex cable 304 extending from the circuit board 302, with processing system(s) provided on or coupled to either of those circuit boards.

The method 900 then proceeds to block 904 where a signal is transmitted through a signal element in a signal layer of the data transmission stack provided in the circuit board flex cable system. With reference to FIGS. 7A and 7B, at block 904 a signal may be transmitted through the signal element 706*a* in the signal layer 706 of the data transmission stack 700 provided in the circuit board flex cable system 300. With reference to FIGS. 8A and 8B, at block 904 a signal may be transmitted through the signal element 806*a* in the signal layer 806 of the data transmission stack 800 provided in the circuit board flex cable system 300. For example, at block 904, a processing system that is coupled to a memory system and one of the circuit boards that is coupled by the flex cable may execute instructions stored on the memory system to generate a signal and transmit that signal via the data transmission stack and through the first circuit board and the flex cable (connected to or extending from that first circuit board) to the second circuit board (which the flex cable is connected to or extending from.)

Figure 10A:
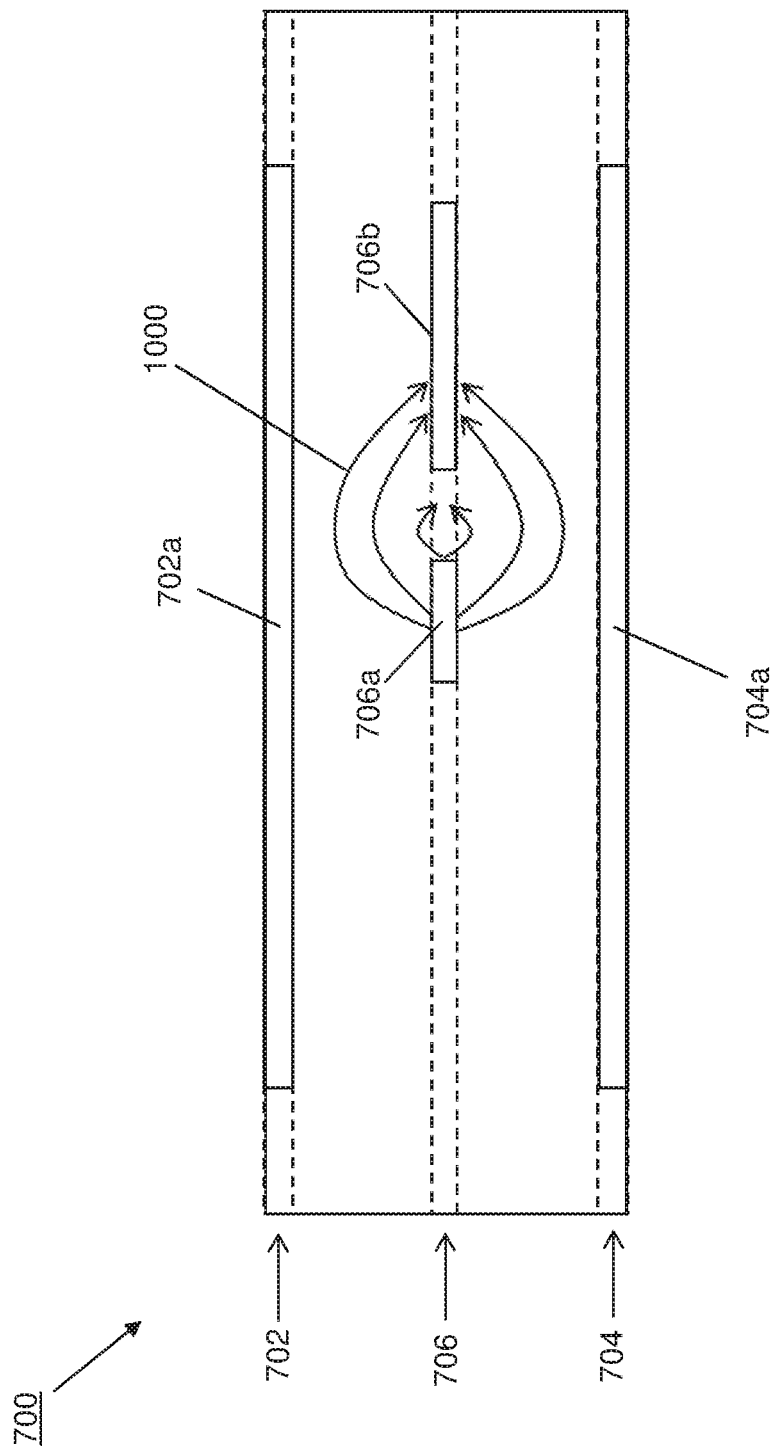
FIG. 10A is a cross sectional view illustrating an embodiment of relatively strong electric field components produced by the data transmission stack of FIG. 7A transmitting a signal in the circuit board flex cable system of FIG. 3.
Figure 10B:
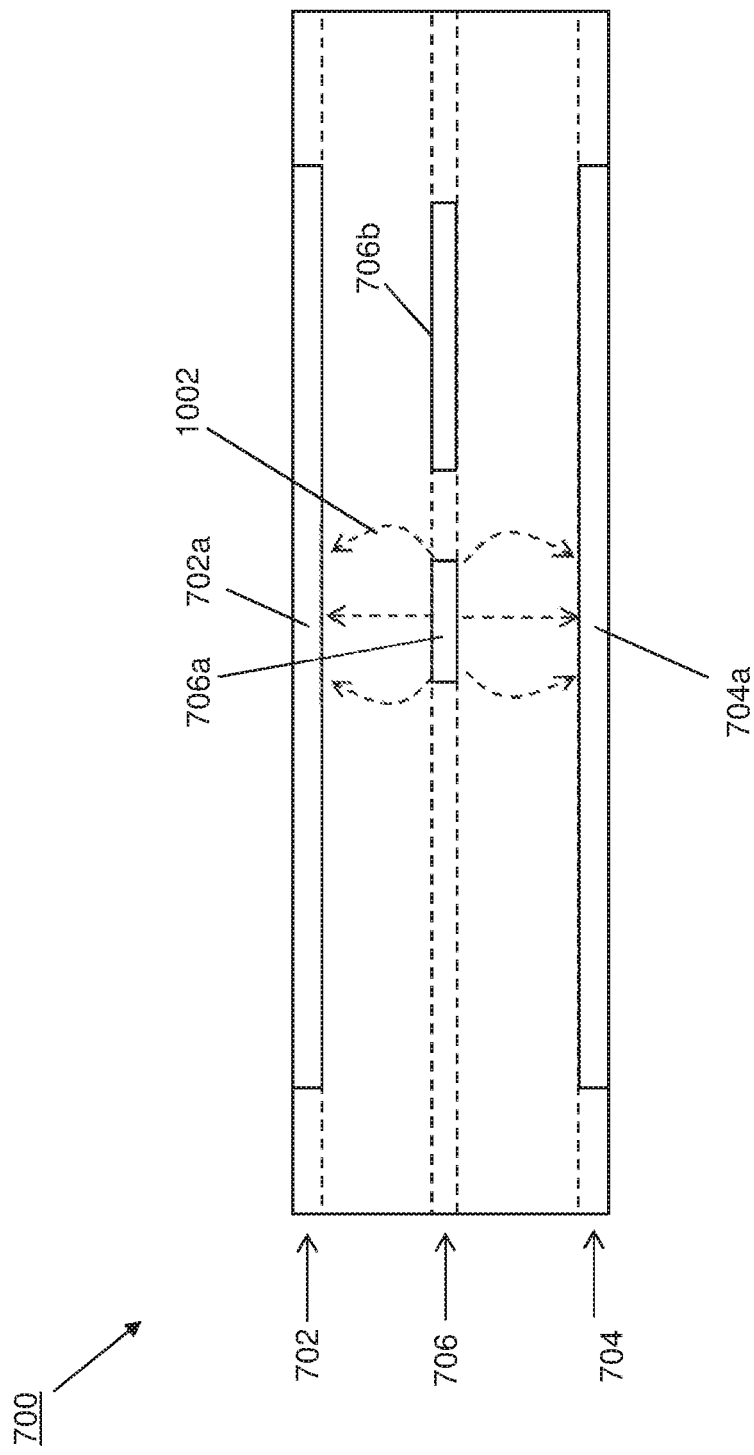
FIG. 10B is a cross sectional view illustrating an embodiment of relatively weak electric field components produced by the data transmission stack of FIG. 7A transmitting a signal in the circuit board flex cable system of FIG. 3.

The method 900 then proceeds to block 906 where the electric field components produced via the signal transmission through the signal element are attracted to ground element(s) in the signal layer of the data transmission stack. The transmission of the signal through the signal element in the data transmission stack provided in the circuit board flex cable system will cause an electric field to be produced and, with reference to FIG. 6, along much of the length of the data transmission stack 400 the electric field components will be attracted to the first grounding element 402*a* in the first ground layer 402 and second grounding element 404*a* in the second ground layer 404. However, with reference to FIGS. 7A, 7B, and 10A, along the portion of the data transmission stack 700 where the flex cable 712 terminates in the circuit board 710 adjacent the flex cable/circuit board transition section 714, relatively strong electric field components 1000 will terminate at the third grounding element 706*b* in the signal layer 706. It has been found that the termination of the electric field components at the third grounding element 706*b* in the signal layer 706 makes the associated impedance drop depend primarily on the spacing of the signal element 706*a* and the third grounding element 706*b* in the signal layer 706, rather than the spacing between the signal element 706*a* and the first and second grounding elements 702*a* and 704*a* in the first and second ground layers 702 and 704, thus reducing the effect that the dielectric thickness (between the signal layer 706 and the first and second ground layers 702 and 704) has on the impedance as well. FIG. 10B illustrates how the relatively weak electric field components 1002 will terminate at the first and second grounding elements 702*a* and 704*a* in the first and second ground layers 702 and 704, but it has been found that those relatively weak electric field components 1002 do not have an appreciable impact on the impedance.

Figure 11B:
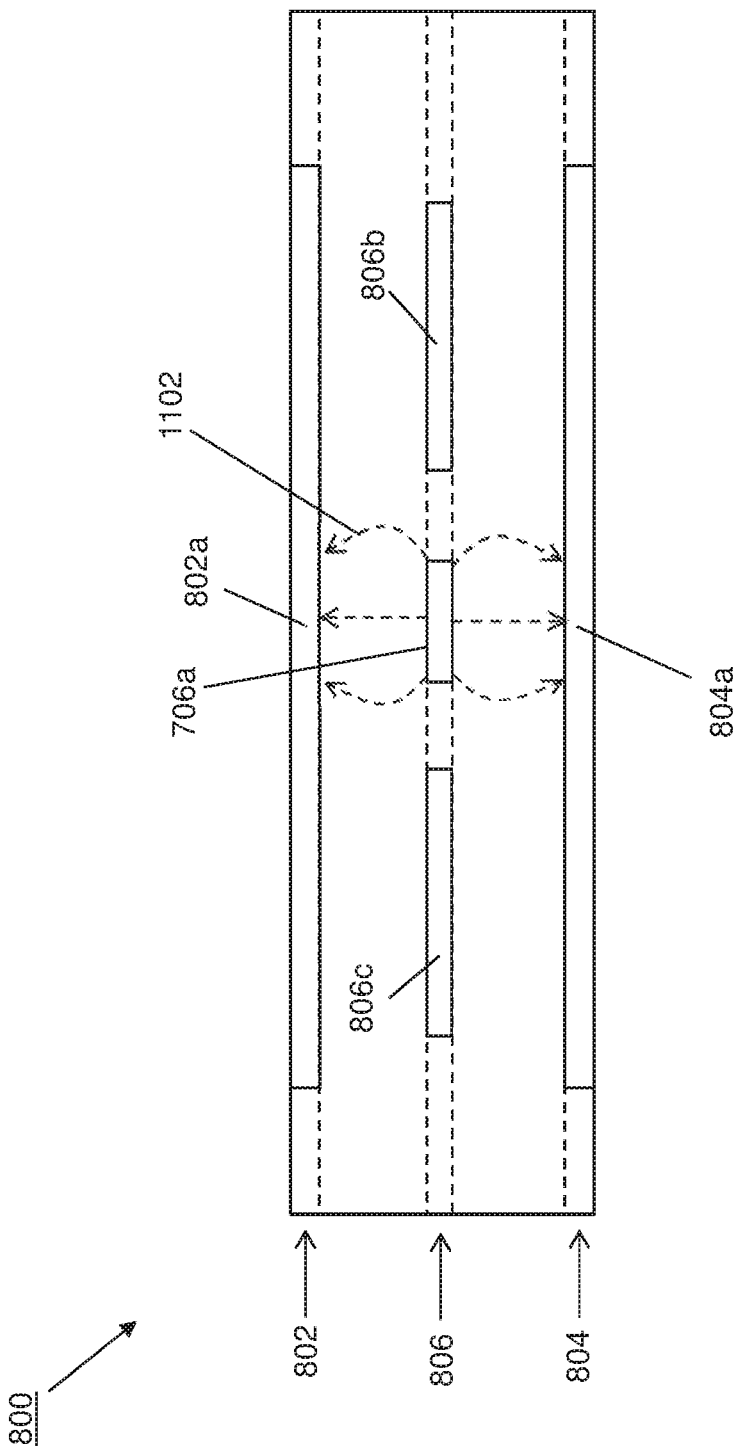
FIG. 11B is a cross sectional view illustrating an embodiment of relatively weak electric field components produced by the data transmission stack of FIG. 8A transmitting a signal in the circuit board flex cable system of FIG. 3.

Similarly, with reference to FIGS. 8A, 8B, and 11A, where the flex cable 812 terminates in the circuit board 810 adjacent the flex cable/circuit board transition section 814, the relatively strong electric field components 1100 will terminate at the third grounding element 806*b* in the signal layer 806, and at the fourth grounding element 806*c* in the signal layer 806. It has been found that the termination of the electric field components at the third grounding element 806*b* and the fourth grounding element 806*c* in the signal layer 806 makes the impedance drop depend primarily on the spacing of the signal element 806*a* and each of the third grounding element 806*b* and the fourth grounding element 806*c* in the signal layer 806, rather than the spacing between the signal element 806*a* and the first and second grounding elements 802*a* and 804*a* in the first and second ground layers 802 and 804, thus reducing the effect that the dielectric thickness (between the signal layer 906 and the first and second ground layers 802 and 804) has on the impedance as well. FIG. 11B illustrates how the relatively weak electric field components 1102 will terminate at the first and second grounding elements 802*a* and 804*a* in the first and second ground layers 802 and 804, but it has been found that those relatively weak electric field components 1102 do not have an appreciable impact on the impedance.

Thus, systems and methods have been described that provide for the transmission of signals via circuit board flex cable system without an associated impedance droop that occurs at the transition from the flex cable to the circuit board in conventional circuit board flex cable systems. The data transmission stack is provided with at least one signal layer grounding element in the signal layer adjacent the signal element, with the signal layer grounding element provided along a portion of the length of the data transmission stack that is located adjacent the transition of the flex cable to the circuit board. When signals are transmitted through the signal element, the electric field components produced by those signals will be attracted to the signal layer grounding element in the signal layer where the flex cable transitions to the circuit board, rather than the first and second grounding elements in first and second ground layers that are spaced apart from the signal layer, which operates to reduce or eliminate the impedance droop that would result if those electric field components were attracted to the first and second grounding elements where the flex cable transitions to the circuit board. As such, cost effective circuit board flex cable systems that terminate the flex cable near the edge of the circuit board may be provided without the associated impedance droops that are produced in conventional circuit board flex cable systems.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A circuit board flex cable system, comprising: a circuit board; a flex cable that extends from the circuit board; and a data transmission stack that extends through the flex cable and the circuit board, wherein the data transmission stack includes: a first ground layer that extends along the length of the data transmission stack and that includes a first grounding element that is configured to couple to ground; a second ground layer that extends along the length of the data transmission stack, that is spaced part from the first ground layer, and that includes a second grounding element that is configured to couple to ground; a signal layer that extends along the length of the data transmission stack, that is located between the first ground layer and the second ground layer, and that includes a signal element that is configured to transmit a signal; and a third grounding element and extends along a length of the data transmission stack adjacent to a termination of the flex cable in the circuit board, that is provided in the signal layer adjacent the signal element, and that is configured to couple to ground, further comprising: a fourth grounding element that extends along the length of the data transmission stack adjacent to the termination of the flex cable in the circuit board, that is provided in the signal layer adjacent the signal element, and that is configured to couple to ground.

2. The system of claim 1, further comprising:
a flex cable/circuit board transition section that extends on each side of the termination of the flex cable in the circuit board where at least one adhesive material in the flex cable meets a prepreg material in the circuit board, wherein the third grounding element is only located adjacent the flex cable/circuit board transition section.

3. The system of claim 1, wherein the third grounding element is configured to attract at least some electric field components that are produced when a signal is transmitted by the signal element and that would otherwise be attracted to one of the first grounding element and the second grounding element.

4. The system of claim 1, further comprising:
a flex cable/circuit board transition section that extends on each side of the termination of the flex cable in the circuit board where at least one adhesive material in the flex cable meets a prepreg material in the circuit board, wherein the fourth grounding element is only located adjacent the flex cable/circuit board transition section.

5. The system of claim 1, wherein the fourth grounding element is configured to attract at least some electric field components that are produced when a signal is transmitted by the signal element and that would otherwise be attracted to one of the first grounding element and the second grounding element.

6. The system of claim 1, further comprising:
a connector that is included on the flex cable opposite the circuit board.

7. An Information Handling System (IHS), comprising: a processing system; a circuit board that is coupled to the processing system; a flex cable that extends from the circuit board; a data transmission stack that extends through the flex cable and the circuit board, wherein the data transmission stack includes: a first ground layer that extends along the length of the data transmission stack and that includes a first grounding element that is coupled to ground; a second ground layer that extends along the length of the data transmission stack, that is spaced part from the first ground layer, and that includes a second grounding element that is coupled to ground; a signal layer that extends along the length of the data transmission stack, that is located between the first ground layer and the second ground layer, and that includes a signal element that is configured to transmit a signal; and a third grounding element and extends along a length of the data transmission stack adjacent to a termination of the flex cable in the circuit board, that is provided in the signal layer adjacent the signal element, and that is coupled to ground, further comprising: a fourth grounding element that extends along the length of the data transmission stack adjacent to the termination of the flex cable in the circuit board, that is provided in the signal layer adjacent the signal element, and that is configured to couple to ground.

8. The IHS of claim 7, further comprising:
a flex cable/circuit board transition section that extends on each side of the termination of the flex cable in the circuit board where at least one adhesive material in the flex cable meets a prepreg material in the circuit board, wherein the third grounding element is only located adjacent the flex cable/circuit board transition section.

9. The IHS of claim 7, wherein the third grounding element is configured to attract at least some electric field components that are produced when a signal is transmitted by the signal element and that would otherwise be attracted to one of the first grounding element and the second grounding element.

10. The IHS of claim 7, further comprising:
a flex cable/circuit board transition section that extends on each side of the termination of the flex cable in the circuit board where at least one adhesive material in the flex cable meets a prepreg material in the circuit board, wherein the fourth grounding element is only located adjacent the flex cable/circuit board transition section.

11. The IHS of claim 7, wherein the fourth grounding element is configured to attract at least some electric field components that are produced when a signal is transmitted by the signal element and that would otherwise be attracted to one of the first grounding element and the second grounding element.

12. The IHS of claim 7, further comprising:
a connector that is included on the flex cable opposite the circuit board and that is coupled to the processing system.

13. A method for transmitting a signal, comprising: connecting a connector on a flex cable to a first circuit board, wherein the flex cable extends from a second circuit board and includes a data transmission stack having: a first ground layer that extends along the length of the data transmission stack and that includes a first grounding element that is coupled to ground; a second ground layer that extends along the length of the data transmission stack, that is spaced part from the first ground layer, and that includes a second grounding element that is coupled to ground; a signal layer that extends along the length of the data transmission stack, that is located between the first ground layer and the second ground layer, and that includes a signal element that is configured to transmit a signal; and a third grounding element and extends along a length of the data transmission stack adjacent to a termination of the flex cable in the circuit board, that is provided in the signal layer adjacent the signal element, and that is coupled to ground; transmitting a signal through the signal element; and attracting, via the third grounding element, at least some of the electric field components that are produced when the signal is transmitted by the signal element and that would otherwise be attracted to one of the first grounding element and the second grounding element, wherein the flex cable includes: a fourth grounding element that extends along the length of the data transmission stack adjacent to the termination of the flex cable in the circuit board, that is provided in the signal layer adjacent the signal element, and that is configured to couple to ground.

14. The method of claim 13, wherein the third grounding element is only located adjacent a flex cable/circuit board transition section that extends on each side of the termination of the flex cable in the circuit board where at least one adhesive material in the flex cable meets a prepreg material in the circuit board.

15. The method of claim 13, wherein each of the third grounding element and the fourth grounding element are only located adjacent a flex cable/circuit board transition section that extends on each side of the termination of the flex cable in the circuit board where at least one adhesive material in the flex cable meets a prepreg material in the circuit board.

16. The method of claim 15, further comprising:
attracting, via the fourth grounding element, at least some of the electric field components that are produced when the signal is transmitted by the signal element and that would otherwise be attracted to one of the first grounding element and the second grounding element.

17. The method of claim 13, wherein the first grounding element, the second grounding element, and the third grounding element are coupled to ground through the second circuit board.

* * * * *